US009743516B2

(12) United States Patent
Edd et al.

(10) Patent No.: US 9,743,516 B2
(45) Date of Patent: Aug. 22, 2017

(54) METHOD FOR FORMING THIN FILM CONDUCTORS ON A SUBSTRATE

(71) Applicant: NCC NANO, LLC, Dallas, TX (US)

(72) Inventors: Andrew E. Edd, Austin, TX (US); Charles C. Munson, Dallas, TX (US)

(73) Assignee: NCC NANO, LLC, Dallas, TX (US)

( * ) Notice: Subject to any disclaimer, the term of this patent is extended or adjusted under 35 U.S.C. 154(b) by 600 days.

(21) Appl. No.: 13/692,570

(22) Filed: Dec. 3, 2012

(65) Prior Publication Data

US 2014/0154427 A1 Jun. 5, 2014

(51) Int. Cl.
*H01B 13/00* (2006.01)
*H05K 1/03* (2006.01)
(Continued)

(52) U.S. Cl.
CPC ........... *H05K 1/0386* (2013.01); *H05K 3/106* (2013.01); *H05K 1/092* (2013.01); *H05K 3/12* (2013.01);
(Continued)

(58) Field of Classification Search
CPC . C23C 16/545; C23C 16/0272; C23C 16/405; C23C 16/509; C23C 16/4401; C23C 16/30; C23C 16/45565; C23C 16/56; C23C 16/01; C23C 16/26; C23C 16/34; C23C 16/401; C23C 16/45525; C23C 16/45524; C23C 16/45595; C23C 16/517; C23C 16/308; C23C 16/345; C23C 16/402; C23C 16/45534; C23C 16/45553; C23C 16/483; C23C 16/45563; C23C 16/06; C23C 16/505; C23C 16/24; C23C 16/047; C23C 16/513; C23C 14/086; C23C 14/28; C23C 14/12; C23C 14/3414; C23C 14/022; C23C 14/24; C23C 14/5806; C23C 14/0652; C23C 14/562; C23C 14/48; C23C 14/025; C23C 14/568; C23C 14/024; C23C 14/0676; C23C 14/5846; C23C 14/14;
(Continued)

(56) References Cited

U.S. PATENT DOCUMENTS 4,078,924 A * 3/1978 Keddie et al. ............. 430/119.6
5,409,732 A * 4/1995 Leonard et al. ................ 427/10
(Continued)

OTHER PUBLICATIONS

Sharpe, W.N.; Pulskamp, J.; Gianola, D.S.; Eberl, C.; Polcawich, R.G.; Thompson, R.J.; Strain Measurements of Silicon Dioxide Microspecimens by Digital Imaging Processing, 2007, Experimental Mechanics, 47, 649-658.*
(Continued)

*Primary Examiner* — Katherine A Bareford
*Assistant Examiner* — Christina McClure
(74) *Attorney, Agent, or Firm* — Russell Ng PLLC; Antony P. Ng

(57) ABSTRACT

A method for forming thin film conductors is disclosed. A thin film precursor material is initially deposited onto a porous substrate. The thin film precursor material is then irradiated with a light pulse in order to transform the thin film precursor material to a thin film such that the thin film is more electrically conductive than the thin film precursor material. Finally, compressive stress is applied to the thin film and the porous substrate to further increase the thin film's electrical conductivity.

14 Claims, 3 Drawing Sheets

(51) Int. Cl.
*H05K 3/10* (2006.01)
*H05K 1/09* (2006.01)
*H05K 3/12* (2006.01)
*H05K 3/14* (2006.01)

(52) U.S. Cl.
CPC ............. *H05K 3/1275* (2013.01); *H05K 3/14* (2013.01); *H05K 2201/0116* (2013.01); *H05K 2203/0143* (2013.01); *H05K 2203/0278* (2013.01); *H05K 2203/1157* (2013.01); *H05K 2203/121* (2013.01); *H05K 2203/125* (2013.01); *H05K 2203/1338* (2013.01); *H05K 2203/1492* (2013.01)

(58) Field of Classification Search
CPC . C23C 14/5886; C23C 14/0031; C23C 14/32; C23C 14/22; C23C 18/14; C23C 18/1608; C23C 18/1893; C23C 18/1651; C23C 18/122; C23C 18/1233; C23C 18/1216; C23C 18/1254; C23C 18/1279; C23C 18/127; C23C 18/1245; C23C 18/1295; C23C 28/04; C23C 28/046; C23C 28/048; C23C 26/00; C23C 4/00; C23C 8/02; C23C 8/22; C23C 8/26; C23C 8/32; C23C 8/38; B41J 13/02; B41J 11/0007; B41J 11/0075; B41J 11/46; B41J 11/008; B41J 15/044; B41J 15/04; B41J 3/4075; B41J 3/407; B41J 3/4071; B41J 2/35; B41J 2/325; B41J 2/365; B41J 29/393; B41J 29/02; B41J 29/38; B41J 17/02; B41J 17/24; B41J 17/42; H05K 13/0413; H05K 13/0061; H05K 13/021; H05K 13/0408; H05K 13/04; H05K 13/08; H05K 1/0386; H05K 1/092; H05K 3/106; H05K 3/12; H05K 3/1275; H05K 3/14; H05K 2201/0116; H05K 2203/0143; H05K 2203/0278; H05K 2203/1157; H05K 2203/121; H05K 2203/125; H05K 2203/1338; H05K 2203/1492; B41F 3/58; B41F 3/80; B41F 13/12; B41F 13/0045; B41F 13/193; B41F 13/04; B41F 13/025; B41F 13/68; B41F 21/05; B41F 21/10; B41F 21/08; B41F 30/04; B41F 31/14; B41F 17/00; B41F 17/26; B65H 2513/10; B65H 2403/20; B65H 2220/09; B65H 2220/01; B65H 2220/02; B65H 2404/143; B65H 2404/662; B65H 2404/1421; B65H 2404/261; B65H 2553/51; B65H 2511/10; B65H 2511/212; B65H 2511/234; B65H 2513/106; B65H 2513/50; B65H 2515/00; B65H 2701/1322; B65H 2701/1922; B65H 2701/1932; B65H 2701/1916; B65H 29/06; B65H 29/68; B65H 29/16; B65H 29/40; B65H 45/28; B65H 9/002; B65H 9/006; B65H 9/14; B65H 16/005; B65H 20/04; B65H 20/24; B65H 2301/3112; B65H 2301/42144; B65H 2301/423222; B65H 2301/4491; B65H 23/063; B65H 23/1825; B65H 23/1882; B65H 23/1955; B65H 2405/531; B65H 2513/20; B65H 2557/23; B65H 2557/242; B65H 31/26; B65H 35/08; B65H 45/20; B65H 5/023; B65H 5/004; B65H 5/18; B65H 5/34; B65H 7/20; B65H 3/24; B05D 5/10; B05D 1/002; B31F 1/2818; B31F 1/2831; B31F 1/284; H03K 17/9622; H03K 2217/960725; G03G 2215/00139; G03G 15/2064; G03G 15/5008; B03D 3/00; B03D 3/12; H02K 31/02; H02K 9/28; C09D 7/005; C09D 5/028
USPC .... 427/331, 361, 559, 365, 359, 356, 510, 8
See application file for complete search history.

(56) References Cited

U.S. PATENT DOCUMENTS

| | | | | |
|---|---|---|---|---|
| 5,982,477 | A | * | 11/1999 | Trafton et al. .................. 355/75 |
| 2001/0008717 | A1 | * | 7/2001 | Iijima .......................... 428/702 |
| 2008/0008822 | A1 | * | 1/2008 | Kowalski et al. ............. 427/58 |
| 2011/0303885 | A1 | * | 12/2011 | Vanheusden et al. ........ 252/513 |

OTHER PUBLICATIONS

Choy, K.L., Chemical Vapour Deposition of Coatings, Progress in Materials Science, 2003, 48, p. 57 and 63.*

* cited by examiner

METHOD FOR FORMING THIN FILM CONDUCTORS ON A SUBSTRATE

BACKGROUND OF THE INVENTION

1. Technical Field

The present invention relates to thin films in general, and, in particular, to a method of forming thin film conductors on a substrate.

2. Description of Related Art

Photonic curing is the high-temperature thermal processing of a thin film using light pulses from a flashlamp. Photonic curing allows thin films on low-temperature substrates to be processed in much shorter time periods (about 1 millisecond) than with an oven (which takes seconds to minutes).

SUMMARY OF THE INVENTION

In accordance with a preferred embodiment of the present invention, a thin film precursor material is initially deposited onto a porous substrate. The thin film precursor material is then irradiated with a light pulse in order to transform the thin film precursor material to a thin film such that the thin film is more electrically conductive than the thin film precursor material. Finally, compressive stress is applied to the thin film and the porous substrate to further increase the thin film's electrical conductivity.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The relatively short processing time enabled by photonic curing can cause problems. One of the artifacts of photonic curing is that the rapid heating of a thin film can generate gas within the thin film. If the gas generation is violent enough, the thin film will undergo a complete cohesive failure, i.e., it may explode. More commonly, the thin film develops a slight porosity. Often, the porosity is inconsequential, but it can, under certain conditions, cause the thin film to be more mechanically fragile than its denser counterparts. Furthermore, if the thin film has any electronic functionality, such as electrical conductivity, its sheet resistance will be higher as a result of the porosity. The increased porosity in the thin film can also exhibit increased surface roughness as well. This can inhibit the attachment of electrical components as well as diminish the cosmetic appearance of the thin film. In addition, the increased porosity can cause enhanced degradation of the thin film over time if the processed thin film is sensitive to elements, such as water or oxygen, commonly found in the environment. Thus, it would be desirable to provide an improved method for forming thin film conductors on a substrate.

Figure 1:
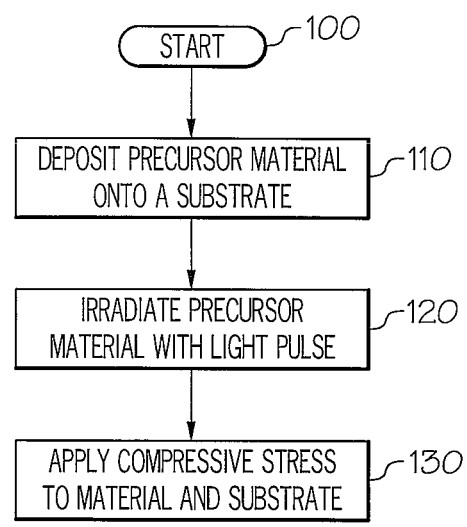
FIG. 1 is a high-level process flow diagram of a method for forming thin film conductors on a substrate, in accordance with a preferred embodiment of the present invention.

Referring now to the drawings and in particular to FIG. 1, there is depicted a flow diagram of a method for forming thin film conductors on a substrate, in accordance with a preferred embodiment of the present invention. Starting at block 100, a thin film precursor material is initially deposited onto a substrate, as shown in block 110. The material is then thermally processed with a photonic curing apparatus such that the thin film precursor material becomes a thin film material, as depicted in block 120. The electrical conductivity of the thin film material is higher than that of the thin film precursor material. Finally, compressive stress is applied to the thin film material located on the substrate to cause the thin film material to densify such that its electrical conductivity of the thin film material can be further increased, as shown in block 130.

A. Depositing Thin Film Precursor Material

The thin film precursor material can be in a particulate form. The thin film precursor material can also be dispersed in a liquid. The thin film precursor material can be deposited onto a substrate by one or combinations of printing methods such as screen printing, inkjet, aerosol jet, flexographic, gravure, laser, pad, dip pen, syringe, or coating methods such as airbrush, painting, roll coating, slot die coating, etc.

Alternatively, the thin film precursor material can be deposited without a liquid including vacuum deposition techniques such as chemical vapor deposition (CVD), PECVD, evaporation, sputtering, etc. Other dry coating techniques in which the thin film precursor material can be deposited include electrostatic deposition, xerography, etc.

The thin film precursor material is preferably contains a metal and/or a metal compound such as an oxide, salt, or organometallic. The thin film precursor material can be copper, nickel, cobalt, silver, carbon, aluminum, silicon, gold, tin, iron, zinc, titanium, etc. Examples of oxides include $Cu_2O$, $CuO$, $Co_3O_4$, $Co_2O_3$, $NiO$, etc. Examples of salts include copper (II) nitrate, copper (II) chloride, copper (II) acetate, copper (II) sulphate, as well as nitrates, chorides, acetates, and sulphates of cobalt, nickel, silver, etc. If the thin film precursor material contains a metal compound, a reducing agent generally accompanies it as well.

The substrate, which may be porous, preferably has a maximum working temperature of less than 450° C. Examples include polymers and cellulose. Examples of porous substrates include fiber based films that are calendered such as cellulose (e.g., paper) or polyethylene (e.g., Tyvek® manufactured by DuPont®). Alternatively, the porosity may be induced in the substrate by foaming the substrate material.

B. Photonic Curing of the Thin Film Precursor Material

When the thin film precursor material is printed within a liquid, thermal processing of the thin film precursor material evaporates the solvent. If the thin film precursor material is the particulate form of the final thin film, the photonic curing additionally sinters the thin film precursor material. If the thin film precursor material is composed of multiple species designed to chemically react with each other (such as a metal compound and a reducing agent), then the thermal processing additionally reacts the precursor thin film material to form the final thin film which is generally a metal.

Figure 2:
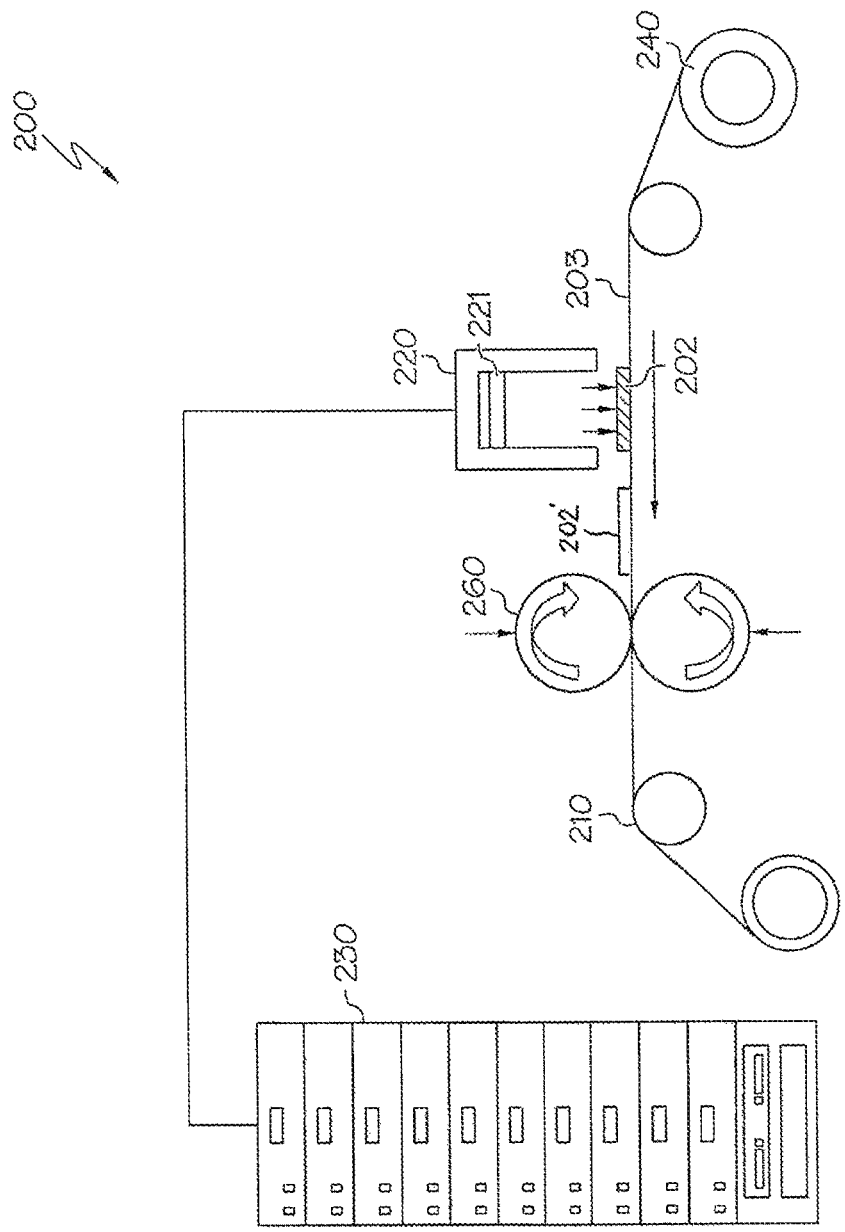
FIG. 2 is a diagram of a photonic curing apparatus, in accordance with a preferred embodiment of the present invention.

Thin film precursor material can be processed thermally using a photonic curing apparatus. With reference now to FIG. 2, there is illustrated a diagram of a photonic curing apparatus, in accordance with a preferred embodiment of the present invention. As shown, a photonic curing apparatus 200 includes a conveyor system 210, a strobe head 220, a relay rack 230, and a reel-to-reel feeding system 240. Photonic curing apparatus 200 is capable of irradiating a thin film precursor material 202 deposited on a substrate 203 situated on a web being conveyed past strobe head 220 at a relatively high speed.

Strobe head 220 includes a high-intensity xenon flashlamp 221 for curing thin film precursor material 202 located on substrate 203. Xenon flashlamp 221 can provide pulses of different intensity, pulse length, and pulse repetition frequency. For example, xenon flashlamp 221 can provide 10 μs to 10 ms pulses with a 3" by 6" wide footprint at a pulse repetition rate of up to 1 kHz. The spectral content of the emissions from xenon flashlamp 221 ranges from 200 nm to 2,500 nm. The spectrum can be adjusted by replacing the quartz lamp with a ceria doped quartz lamp to remove most of the emission below 350 nm. The quartz lamp can also be replaced with a sapphire lamp to extend the emission from approximately 140 nm to approximately 4,500 nm. Xenon flashlamp 221 can also be a water wall flash lamp that is sometimes referred to as a Directed Plasma Arc (DPA) lamp.

Relay rack 230 includes an adjustable power supply, a conveyance control module, and a strobe control module. The adjustable power supply can produce pulses with energy of up to 4 kJ per pulse. Adjustable power supply is connected to xenon flashlamp 221, and the intensity of the emission from xenon flashlamp 221 can be varied by controlling the amount of current passing through xenon flashlamp 221.

The adjustable power supply controls the emission intensity of xenon flashlamp 221. The power, pulse duration, and pulse repetition frequency of the emission from xenon flashlamp 221 are electronically adjusted in real time and synchronized to the web speed to allow optimum curing of thin film precursor material 202 without damaging substrate 203, depending on the optical, thermal, and geometric properties of thin film precursor material 202 and substrate 203. Preferably, the time duration of irradiation of each light pulse is less than the time to thermal equilibration time of the stack comprising thin film precursor material 202 on substrate 203.

During the irradiation with light pulses, substrate 203 as well as thin film precursor material 202 is being moved by conveyor system 210. Conveyor system 210 moves thin film precursor material 202 under strobe head 220 where thin film precursor material 202 is cured by rapid light pulses from xenon flashlamp 221. The power, duration, and repetition rate of the emissions from xenon flashlamp 221 are controlled by the strobe control module, and the speed at which substrate 203 is being moved past strobe head 220 is determined by the conveyor control module.

When xenon flashlamp 221 is emitting light pulses, thin film precursor material 202 is momentarily heated to provide the energy for curing thin film precursor material 202. When a rapid pulse train is synchronized to moving substrate 203, a uniform cure can be attained over an arbitrarily large area as each section of thin film precursor material 202 may be exposed to multiple light pulses, which approximates a continuous curing system such as an oven.

C. Compressing Processed Material

After thin film precursor material 202 located on substrate 203 has been photonically cured with flashlamp 221 to form a thin film material 202', compressive stress is applied to thin film material 202' and substrate 203 in order to densify thin film material 202 and substrate 203. Thin film material 202' on substrate 203 can be compressed by one or combinations of existing technologies such as stamping, forging, rolling, calendering, pressing, embossing, laminating, etc.

Rolling is preferably used in a reel-to-reel manufacturing setting by a set of pinch rollers 260. Pinch rollers 260 are loaded, in compression, such that the peak pressure applied to thin film material 202' and substrate 203 exceeds 25% of the ultimate tensile strength (UTS) of the bulk thin film material after photonic curing at standard conditions. For a relatively soft and ductile metal like copper, the preferred compression pressure range is between 7,500 and 30,000 psi (i.e., 25% to 100% of its ultimate tensile strength at standard conditions).

Because substrate 203 is porous, it is compressible and responds to compression by reducing in thickness while keeping the same width, such as a fiber based substrate like paper. This single dimensional change ensures that thin film material 202' is not damaged by lateral deformation of substrate 203. The peak pressure capable of being applied by pinch rollers 260 to polymer substrates that are non-porous, such as PET, may be limited because PET is a low-temperature polymer that tends to be relatively soft. PET will deform laterally at a lower pressure threshold than other substrates, which can cause damage to thin film material 202' and substrate 203.

Pinch rollers 260 are driven at angular velocity $\omega = v/r$, where $\omega$ is the angular velocity of pinch rollers 260 and r is the radius of pinch rollers 260, adjusted, and synchronized to the web speed, v, to allow optimum densification of thin film material 202' without damaging substrate 203, depending on the mechanical and geometric properties of thin film material 202' and substrate 203.

In certain situations, it may be advantageous to apply dynamic compressive stress (oscillating magnitude over time) with pinch rollers 260, driven at a certain frequency, to thin film material 202' on substrate 203 to achieve high peak pressures with a lower average force on pinch rollers 260 to extend tool lifetime and/or increase maximum web speeds.

Heating pinch rollers 260 to a temperature between standard temperature and the maximum working temperature of substrate 203 can decrease the required pressure to achieve a similar result with standard temperature pinch rollers 260 due to the softening of thin film material 202' during compression.

Compressive stress applied to thin film material 202' deposited on substrate 203 can increase the density of thin film material 202'. A particle or solution-based deposited material has a density lower than the bulk precursor material due to a residual pore structure within the deposited layer. Additionally, the photonic curing process may introduce additional porosity in thin film material 202'. The volume of pore space relative to layer volume (volume fraction) will vary depending on material, process, and particle size. Reducing the pore space volume fraction densifies the material improving its performance in terms of increased electrical conductivity if it is conductive, improved mechanical stability and hardness, alters the surface properties like reducing surface roughness and improving solderability, and improved chemical resistance if the material is prone to corrosion by reducing the surface area to volume ratio. Compressing thin film material 202' increases it density, which brings deposited thin film material 202' closer to the properties of the bulk thin film material.

The following examples illustrate various methods of applying compressive stress to thin film materials located on a substrate. The results of compressive stress are densification of thin film material on the substrate such that conductivity, mechanical stability, and chemical resistance of the thin film material are improved.

Example 1

Compressive Stress Applied to Thin Films of Mesoporous Copper on Paper Substrates A screen printable version of a copper oxide reduction ink (part no. ICI-021 available from NovaCentrix in Austin, Tex.) was printed on Wausau 110 lb exact index paper with a 230 mesh flat screen. The print was then dried in a 140° C. oven for 5 minutes to remove excess solvents. Initially, the ink had a sheet resistance that was ~1 GΩ/□. That is, the resistance as measured by an ordinary multimeter was an open circuit.

The ink was converted to a conductive mesoporous copper thin film using a photonic curing apparatus (such as PulseForge® 3300 X2 photonic curing system manufactured by NovaCentrix in Austin, Tex.). The settings on the machine used for curing were 430 V, 1,600 ms, overlap factor of 5, and at a web speed of 16 feet per minute. The sheet resistance after photonic curing was 17.2 mΩ/□.

The mesoporous copper thin film underwent densification via the following process: A pair of steel rollers (1.7" diameter×3.0" length) applied a compressive force of 2,875 lbf to the foamed copper thin film on paper as it was drawn through the rollers. The cross sectional area of compression was 0.074 in², yielding an average 38,850 psi applied to the as-printed conductors. Densification, via compression, of the mesoporous copper reduced the sheet resistance to 9.3 mΩ/□. Thus, compressing the mesoporous copper decreased its resistivity by 46%.

Additional benefits to the overall performance of the compressed copper film, besides improved electrical conductivity, became apparent during surface mounted device (SMD) attachment evaluation, mechanical stability testing, and environmental testing.

Compressed copper has demonstrated a significantly improved success rate of attaching SMD components over as-converted mesoporous copper. The failure rate was 50% for thermode bonded SMD silicon chips to the mesoporous copper. Compressed copper demonstrated a much higher success rate of 90% due to its low surface roughness. Additionally, the reduced surface roughness alters the optical properties of the converted copper from matte to nearly specular reflectivity at high pressures.

Figure 3:
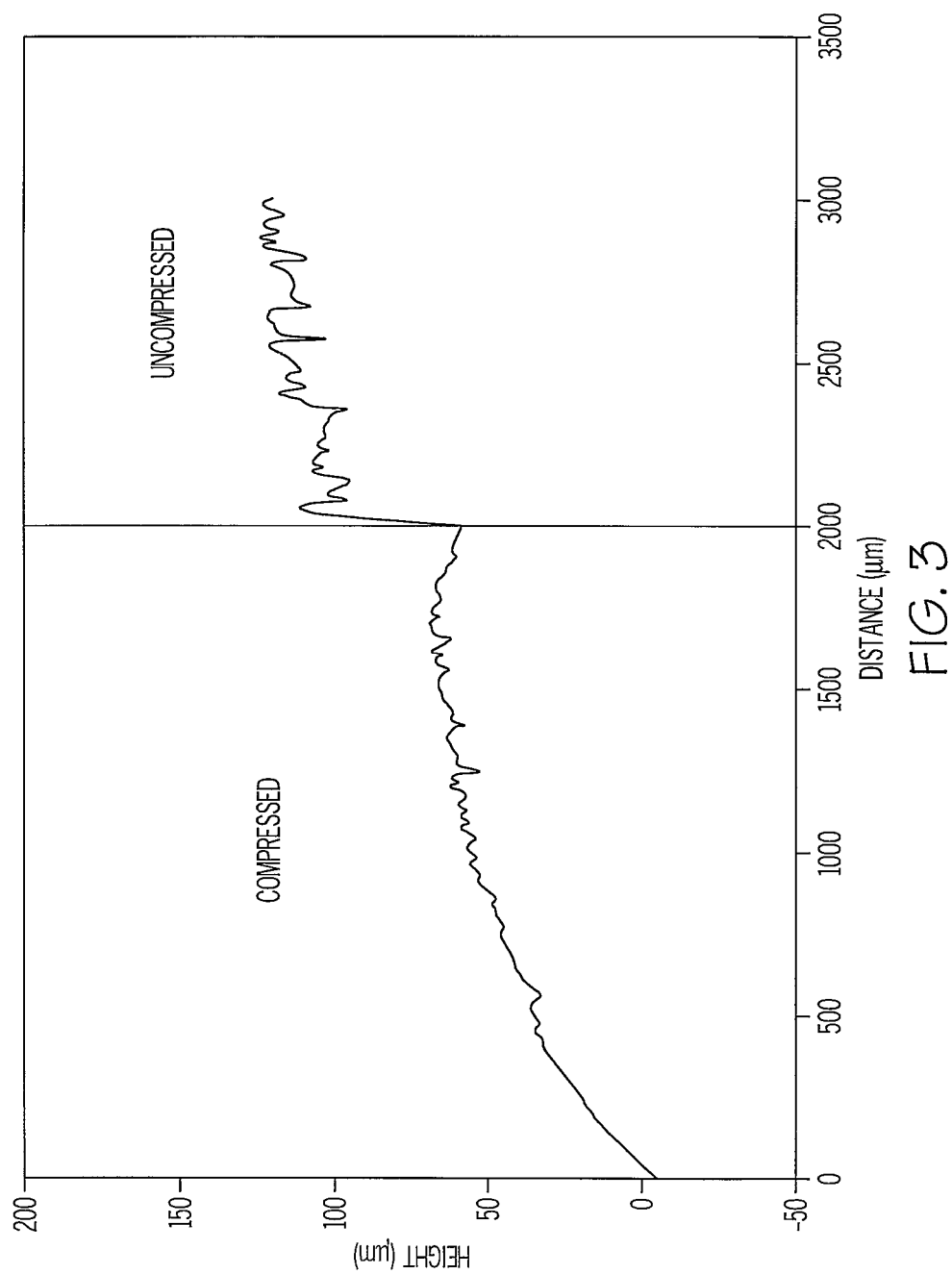
FIG. 3 is a graph showing the height profile of a copper film on a paper substrate before and after being compressed using the method depicted in FIG. 1.

Referring now to FIG. 3, there is illustrated a graph showing a height profile of foamed copper on paper before and after compression. Both the total height and the surface roughness are reduced indicating increased density and reduced surface roughness of the copper film. Specifically, the surface roughness was reduced from 25 micron to 5 microns. The entire thin film stack was reduced in thickness by about 50 microns.

For copper on paper, there is a saturation point for what pressures improve the electrical conductivity below the UTS of pure copper. As-converted mesoporous copper measured about 30 mΩ/□ in sheet resistance. Mesoporous copper film compressed at 8,300 psi (27% UTS of pure copper) measured 22 mΩ/□ in sheet resistance. At a pressure of 12,000 psi (40% UTS of pure copper) the sheet resistance reached a minimum value of 20 mΩ/□ (saturation point). Further increasing the applied pressure to 25,000 psi (83% UTS of pure copper) saw no improvement on the sheet resistance of the copper films. However, when tracking the conductivity over time it was observed that copper films compressed at 12,000 psi gained in sheet resistance by 20% over 40 days in air. The copper films compressed at 25,000 psi only gained in sheet resistance by 5% over 40 days in air. Therefore, pressures beyond 40% UTS of pure copper (12,000 psi) are required for corrosion resistance and stability over time for the copper thin film.

Even though increasing the applied stress by 2× did not improve the electrical conductivity of the films, the stability was greatly improved. This means that the pore space volume fraction was reduced with the increased pressure (25,000 psi) and/or the copper material was completely yielded and did not "spring back" like the films compressed at half the pressure. The spring back effect is commonly seen in traditional sheet metal forming. In a manufacturing environment, in order to reduce a piece of sheet metal in gauge, the material must be compressed or rolled through multiple stages. A single stage gauge reduction is not useful due to the metal's tendency to expand in thickness after being reduced because of the elastic deformation component of the process. In this case, the foamed copper compressed at 80% UTS yields completely and prevents residual elastic stress from degrading overall performance and stability of the compressed film.

After photonic curing, the converted mesoporous copper has a high surface area to volume ratio contributing to its poor native corrosion resistance. Compressing the mesoporous copper greatly reduces the surface area to volume ratio of the copper and improves the material's corrosion resistance. Environmental testing was performed on bare as-converted and compressed copper films on paper substrate. Compressed copper demonstrates a significantly improved corrosion resistance when tested in an environment at 85° C./100% relative humidity for 24 hours. Uncoated mesoporous copper on paper does not survive such an environmental test, but compressed copper survives un-coated and without a detectable change in conductivity. Uncoated compressed copper films passed an industry standard (1,000 hours at 85° C./85% relative humidity) with only an increase in resistivity by 20%. Additional cost benefits pertaining to production become apparent as required volumes of materials for encapsulating the compressed copper films are decreased relative to as-converted copper.

When it is desirable to only reduce the surface roughness of the thin film, significantly lower pressure may be used. As-cured films of mesoporous copper on paper substrate exhibiting average surface roughness of 5 microns were compressed at 2,600 psi (9% UTS of pure copper) reducing the average surface roughness to 2 microns. At this pressure, the electrical conductivity of the mesoporous copper films was unchanged.

Example 2

Compressive Stress Applied to Porous Thin Films of Nickel on Paper Substrates A screen printable version of a nickel flake ink (part no. 79-89-16 available from NovaCentrix in Austin, Tex.) was printed on Wausau 110 lb exact index paper with a 230 mesh flat screen. The prints were dried in a 150° C. oven for 5 minutes to remove excess solvents. After oven drying the sheet resistance measured 77Ω/□.

The dried ink was photonically cured to form a highly conductive porous nickel thin film using a photonic curing apparatus (such as PulseForge® 3300 X2 photonic curing system manufactured by NovaCentrix in Austin, Tex.). The settings on the photonic curing apparatus used for curing were 540 V, 1,100 ms, overlap factor of 4, at a web speed of 14 feet per minute. Photonic curing reduced the sheet resistance of the nickel film on the paper substrate to 550 mΩ/□.

The porous nickel thin film underwent densification via the following process: A pair of steel rollers (1.7" diameter× 3.0" length) applied a compressive force of 2,464 lbf to the porous nickel thin films on paper as they were drawn through the rollers. The cross-sectional area of compression was 0.074 in$^2$, yielding an average 33,300 psi applied to the printed conductors. Densification, via compression, of the porous nickel reduced the sheet resistance to 60 mΩ/□. Compressing the porous nickel decreased its resistivity by 89%.

Example 3

Compressive Stress Applied to Thin Films of Silver on Paper Substrates

A screen printable version of a silver flake ink (part no. HPS-030LV available from NovaCentrix in Austin, Tex.) was printed on Wausau 110 lb exact index paper with a 230 mesh flat screen. The print was dried in a 170° C. oven for 5 minutes to remove excess solvents and cause sintering of the silver flakes. After oven drying the sheet resistance measured 16.9 mΩ/□.

The 5 micron thick silver trace on paper substrate underwent densification via the following process: A pair of steel rollers (1.7" diameter×3.0" length) applied a compressive force of 1,848 lbf to the silver thin films on paper as they were drawn through the rollers. The cross sectional area of compression was 0.074 in$^2$, yielding an average 24,970 psi applied to the printed conductors. Densification, via compression, of the silver reduced the sheet resistance to 14.2 mΩ/□. Compressing the silver film decreased the resistivity by 16%.

Example 4

Compressive Stress Applied to Thin Films of Mesoporous Copper on PET Substrates

A screen printable version of a copper oxide reduction ink (part no. ICI-021 available from NovaCentrix in Austin, Tex.) was printed on ST505 polyethylene terephthalate (PET) film with a 230 mesh flat screen. The print was then dried in a 140° C. oven for 5 minutes to remove excess solvents. Initially, the ink had a sheet resistance that was ~1 GΩ/□. That is, the resistance as measured by an ordinary multimeter was an open circuit.

The ink was converted to a conductive mesoporous copper thin film using a photonic curing apparatus (Pulse-Forge® 3300 X2 photonic curing system manufactured by NovaCentrix in Austin, Tex.). The settings on the machine used for curing were 360 V, 2,500 ms, overlap factor of 1, and at a web speed of 16 feet per minute. The sheet resistance after photonic curing was 46 mΩ/□.

The mesoporous copper thin film underwent densification via the following process: A pair of steel rollers (1.7" diameter×3.0" length) applied a compressive force of 1,027 lbf to the foamed copper thin film on paper as it was drawn through the rollers. The cross sectional area of compression was 0.074 in$^2$, yielding an average 13,873 psi applied to the printed conductors. Densification, via compression, of the mesoporous copper reduced the average sheet resistance to 34 mΩ/□. Thus, compressing the mesoporous copper decreased its resistivity by 26% and reduced its surface roughness. The pressure applied to the thin films of mesoporous copper on PET was nearly half the pressure used in Example 1. This was done to preserve the copper film due to the tendency of PET to deform laterally at pressures exceeding its yield pressure of 15,000 psi.

When compressive stress is applied only to the printed areas of a thin film (i.e., not the entire thin film and substrate), significantly higher pressures (greater than the yield pressure of the substrate such as PET) may be applied to the thin film of mesoporous copper and nonporous PET substrate to increase the density and electrical conductivity of the thin film. The limitation of rolling compression at pressures greater than the yield pressure of the nonporous substrate is removed as lateral deformation local to the thin film conductor does not disrupt the thin film conductor's contiguity, where complete areal compression does. This type of area specific compression of printed circuits may be accomplished through the use of a stamping tool such as an embossed roller. The embossed roller may have a raised pattern matching the printed circuit pattern and would contact and compress only in the printed regions on the substrate, leaving the majority of substrate uncompressed. Generally, this technique is useful for printed depositions covering less than 50% of the substrate. As the percentage of deposition area increases to 100%, the area specific compression tends to behave more like rolling compression where the entire web of substrate is compressed, thus forfeiting the advantage.

As has been described, the present invention provides a method for forming thin film conductors on a substrate.

While the invention has been particularly shown and described with reference to a preferred embodiment, it will be understood by those skilled in the art that various changes in form and detail may be made therein without departing from the spirit and scope of the invention.

What is claimed is:

1. A method for forming a thin film conductor on a substrate, said method comprising:
    depositing a thin film precursor material onto a porous substrate;
    irradiating said thin film precursor material with a light pulse to transform said thin film precursor material to a thin film, wherein said thin film is more electrically conductive than said thin film precursor material; and
    applying compressive stress to said thin film and said porous substrate by a pair of pinch rollers to further increase said thin film's electrical conductivity, wherein said pinch rollers are driven at ω=v/r, where ω is an angular velocity of said pinch rollers, r is a radius of said pinch rollers, and v is a moving speed of said thin film.

2. The method of claim 1, wherein said depositing is performed by printing.

3. The method of claim 1, wherein said porous substrate is paper.

4. The method of claim 1, wherein said porous substrate is polymer.

5. The method of claim 1, wherein said applying compressive stress is accomplished by rolling or calendaring.

6. The method of claim 1, wherein said compressive stress exceeds 25% of the ultimate tensile strength of said thin film at standard temperature and pressure.

7. The method of claim 1, wherein said depositing is performing by chemical vapor deposition.

8. The method of claim 1, wherein said thin film precursor material includes a particulate metal.

9. The method of claim 8, wherein said particulate metal is a metal selected from the group consisting of copper, nickel, cobalt, silver and combinations thereof.

10. The method of claim 1, wherein said thin film precursor material includes a particulate metal oxide and a reducing agent.

11. The method of claim 1, wherein said thin film precursor material includes a metal salt and a reducing agent.

12. A method for forming a thin film conductor on a substrate, said method comprising:
   depositing a thin film precursor material onto a porous substrate;
   irradiating said thin film precursor material with a light pulse to transform said thin film precursor material to a thin film, wherein said thin film is more electrically conductive than said thin film precursor material; and
   applying compressive stress to said thin film and said porous substrate to further increase said thin film's electrical conductivity, wherein said applying of compressive stress oscillates in magnitude with time.

13. The method of claim 12, wherein said depositing is performing by chemical vapor deposition.

14. The method of claim 12, wherein said applying compressive stress is accomplished by rolling.

* * * * *